United States Patent
Schultz et al.

(10) Patent No.: US 10,692,692 B2
(45) Date of Patent: Jun. 23, 2020

(54) SYSTEM AND METHOD FOR PROVIDING A CLEAN ENVIRONMENT IN AN ELECTRON-OPTICAL SYSTEM

(71) Applicant: KLA-Tencor Corporation, Milpitas, CA (US)

(72) Inventors: William G. Schultz, San Jose, CA (US); Gildardo Delgado, Livermore, CA (US); Garry A. Rose, Livermore, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 15/164,273

(22) Filed: May 25, 2016

(65) Prior Publication Data

US 2016/0358741 A1    Dec. 8, 2016

Related U.S. Application Data

(60) Provisional application No. 62/166,691, filed on May 27, 2015.

(51) Int. Cl.
*H01J 37/28* (2006.01)
*H01J 3/02* (2006.01)
(Continued)

(52) U.S. Cl.
CPC .............. *H01J 37/28* (2013.01); *H01J 3/027* (2013.01); *H01J 3/40* (2013.01); *H01J 7/18* (2013.01);
(Continued)

(58) Field of Classification Search
None
See application file for complete search history.

(56) References Cited

U.S. PATENT DOCUMENTS 1,863,538 A * 6/1932 De Smet ................ B24B 3/38
451/213
3,513,619 A * 5/1970 Kochalski ............ B65B 19/10
53/500

(Continued)

FOREIGN PATENT DOCUMENTS

EP      0736891 A1 * 10/1996
EP      0736891 A1 * 10/1996 .............. H01J 9/025
(Continued)

OTHER PUBLICATIONS

PCT Search Report for International Application No. PCT/US2016/034297 dated Sep. 1, 2016, 3 pages.
(Continued)

*Primary Examiner* — Andrew Smyth
(74) *Attorney, Agent, or Firm* — Suiter Swantz pc llo

(57) ABSTRACT

An electron extractor of an electron source capable of absorbing contaminant materials from a cavity proximate to the extractor is disclosed. The electron extractor includes a body. The body of the electron extractor is formed from one or more non-evaporable getter materials. The one or more non-evaporable getter materials absorb one or more contaminants contained within a region proximate to the body of the electron extractor. The body of the electron extractor is further configured to extract electrons from one or more emitters posited proximate to the body of the electron extractor.

17 Claims, 14 Drawing Sheets

(51) Int. Cl.
*H01J 37/065* (2006.01)
*H01J 7/18* (2006.01)
*H01J 3/40* (2006.01)

(52) U.S. Cl.
CPC ....... *H01J 37/065* (2013.01); *H01J 2237/022* (2013.01); *H01J 2237/06341* (2013.01); *H01J 2237/182* (2013.01)

(56) References Cited

U.S. PATENT DOCUMENTS

| | | | | |
|---|---|---|---|---|
| 3,766,542 | A * | 10/1973 | Tomozawa | H03M 7/3048 341/61 |
| 4,019,077 | A | 4/1977 | Sakitani | |
| 4,088,456 | A | 5/1978 | Giorgi et al. | |
| 4,863,538 | A | 9/1989 | Deckard | |
| 5,033,278 | A * | 7/1991 | Hossfield | D06F 37/40 188/166 |
| 5,127,777 | A * | 7/1992 | Fischer | B23B 51/0027 408/236 |
| 5,150,001 | A * | 9/1992 | Crewe | H01J 37/073 313/552 |
| 5,223,766 | A * | 6/1993 | Nakayama | H01J 29/94 313/309 |
| 5,465,954 | A * | 11/1995 | Takemoto | B65H 5/062 271/251 |
| 5,507,146 | A * | 4/1996 | Bjerklie | F17C 6/00 62/320 |
| 5,545,396 | A * | 8/1996 | Albert | A61K 49/1806 424/9.3 |
| 5,583,393 | A * | 12/1996 | Jones | H01J 1/304 313/309 |
| 5,741,017 | A * | 4/1998 | Chen | A63C 17/1436 188/5 |
| 5,789,859 | A * | 8/1998 | Watkins | H01J 7/186 313/495 |
| 5,903,098 | A * | 5/1999 | Jones | G01R 33/10 313/495 |
| 5,908,579 | A | 6/1999 | Conte et al. | |
| 5,917,156 | A * | 6/1999 | Nobori | H05K 3/3421 174/250 |
| 6,033,278 | A | 3/2000 | Watkins et al. | |
| 6,127,777 | A | 10/2000 | Watkins et al. | |
| 6,465,954 | B1 | 10/2002 | Kerslick et al. | |
| 6,507,146 | B2 | 1/2003 | Moore | |
| 6,545,396 | B1 | 4/2003 | Ohki et al. | |
| 6,741,017 | B1 | 5/2004 | Ide et al. | |
| 6,917,156 | B2 | 7/2005 | Moore | |
| 7,315,115 | B1 * | 1/2008 | Curtin | H01J 1/30 313/110 |
| 7,489,071 | B2 * | 2/2009 | Chien | H01J 7/18 313/309 |
| 7,550,913 | B2 * | 6/2009 | Guo | H01J 29/467 313/309 |
| 7,608,824 | B2 * | 10/2009 | Korsah | B82Y 30/00 250/338.4 |
| 7,608,998 | B2 * | 10/2009 | Ramamoorthi | F04B 37/02 313/549 |
| 7,745,995 | B2 * | 6/2010 | Liu | H01J 29/94 313/495 |
| 8,513,619 | B1 * | 8/2013 | Nasser-Ghodsi | H01J 37/04 250/397 |
| 8,766,542 | B2 | 7/2014 | Cho et al. | |
| 2003/0002627 | A1 * | 1/2003 | Espinosa | B82Y 10/00 378/136 |
| 2003/0141802 | A1 * | 7/2003 | Liebeskind | H01J 29/94 313/495 |
| 2005/0085052 | A1 * | 4/2005 | Chen | H01L 23/26 438/471 |
| 2006/0164009 | A1 * | 7/2006 | Ramamoorthi | F04B 37/02 313/547 |
| 2007/0145266 | A1 * | 6/2007 | Cohen | H01J 37/04 250/310 |
| 2007/0145267 | A1 * | 6/2007 | Adler | H01J 37/04 250/310 |
| 2008/0042547 | A1 * | 2/2008 | Chien | H01J 7/18 313/495 |
| 2008/0284332 | A1 * | 11/2008 | Adamec | H01J 7/18 313/558 |
| 2010/0066380 | A1 * | 3/2010 | Knapp | G01L 21/32 324/462 |
| 2012/0085925 | A1 * | 4/2012 | Kasuya | B82Y 10/00 250/453.11 |
| 2013/0234025 | A1 * | 9/2013 | Monthioux | H01J 1/3044 250/311 |
| 2014/0331861 | A1 * | 11/2014 | Makarov | H01J 49/067 95/90 |
| 2014/0339418 | A1 * | 11/2014 | Makarov | H01J 49/067 250/282 |
| 2016/0086766 | A1 * | 3/2016 | Takahoko | H01J 37/18 250/492.3 |

FOREIGN PATENT DOCUMENTS

| | | | |
|---|---|---|---|
| EP | 0736891 B1 * | 9/1998 | |
| EP | 0736891 B1 * | 9/1998 | ............. H01J 9/025 |
| EP | 1333465 A2 | 8/2003 | |
| JP | 352055856 A | 5/1977 | |
| JP | 108153460 A | 6/1996 | |
| JP | 2001210225 A | 8/2001 | |
| JP | 2003242914 A | 8/2003 | |
| JP | 2003308776 A | 10/2003 | |
| JP | 2004063177 A | 2/2004 | |
| JP | 2006294481 A | 10/2006 | |
| JP | 2013100464 A * | 5/2013 | |
| JP | 2013100464 A * | 5/2013 | |
| JP | WO2014181685 A1 | 2/2017 | |
| WO | 2012016198 A2 | 2/2012 | |
| WO | WO-2012016198 A2 * | 2/2012 | ........... G01T 1/2018 |
| WO | WO 2012016198 A2 * | 2/2012 | ........... G01T 1/2018 |
| WO | WO-2012016198 A3 * | 2/2012 | |
| WO | 2010146833 A | 11/2012 | |
| WO | 2013169825 A1 | 11/2013 | |
| WO | WO-2013169825 A1 * | 11/2013 | |
| WO | WO 2013169825 A1 * | 11/2013 | ............. H01J 37/04 |
| WO | WO-2012016198 A2 * | 3/2014 | |
| WO | WO-2012016198 A3 * | 3/2014 | ........... G01T 1/2018 |
| WO | WO 2012016198 A3 * | 3/2014 | ........... G01T 1/2018 |

OTHER PUBLICATIONS

Extended Search Report dated Dec. 14, 2018 for EP Application No. 16800701.1.
Examination Report dated Jan. 31, 2020 for EP Application No. 16800701.1.
Office Action dated Mar. 31, 2020 for JP Application No. 2017-561622.

* cited by examiner

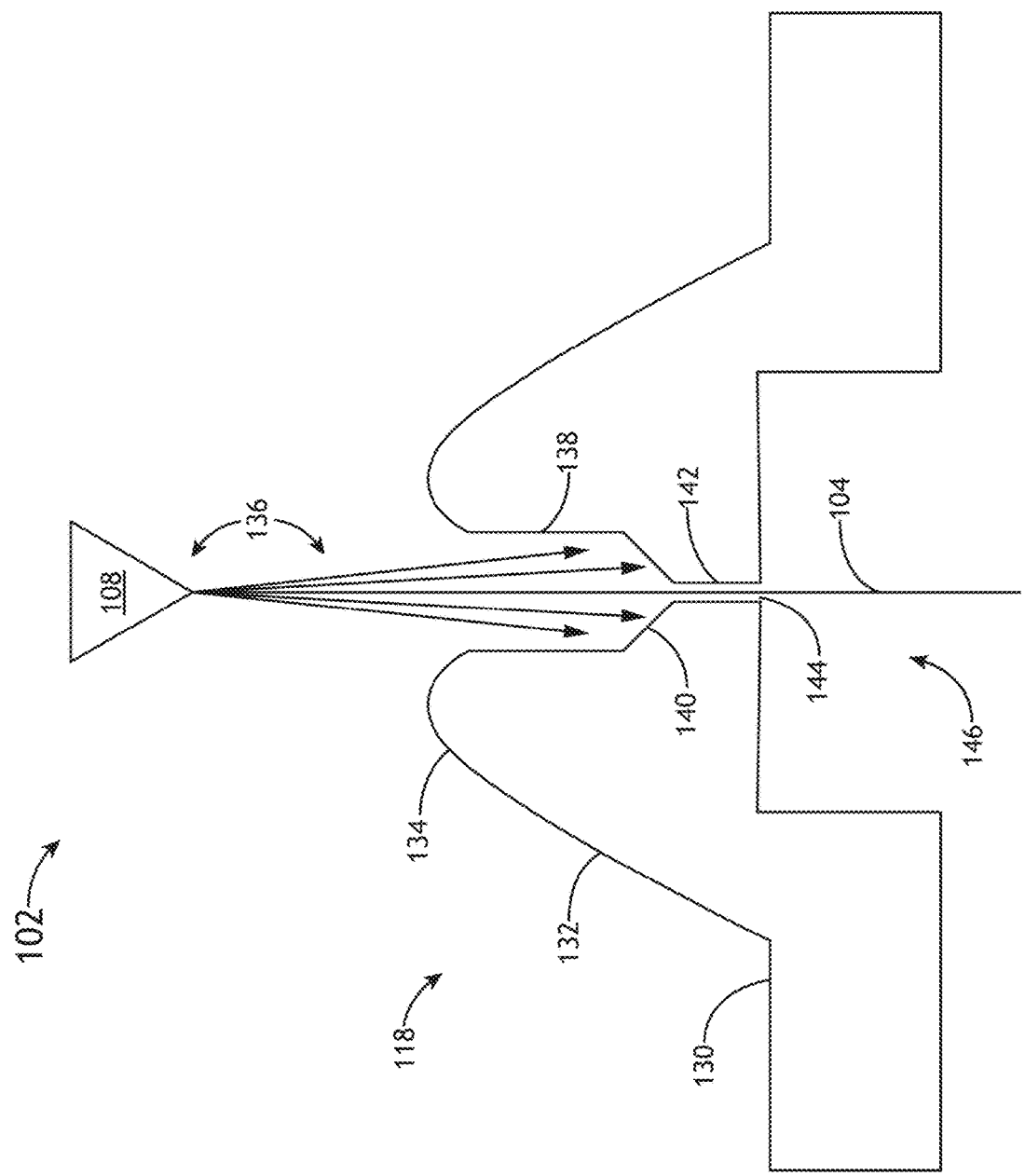

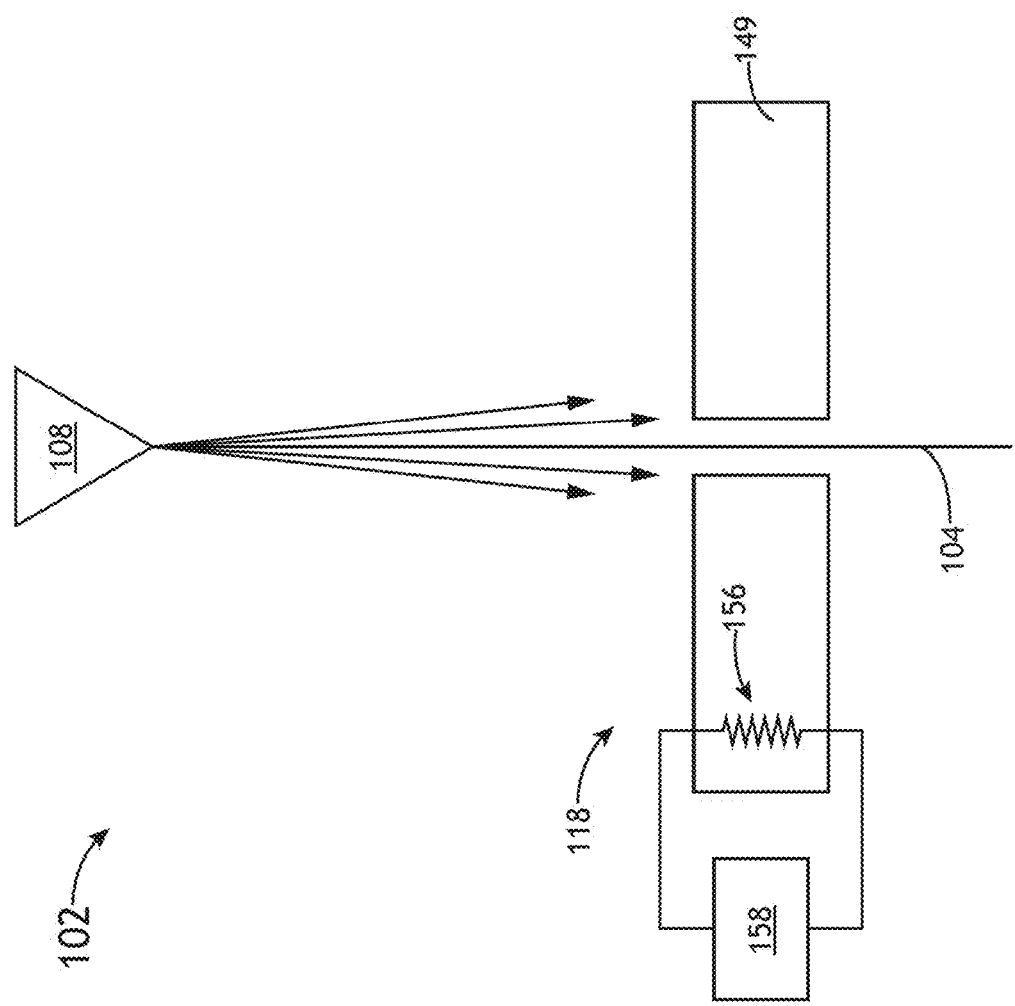

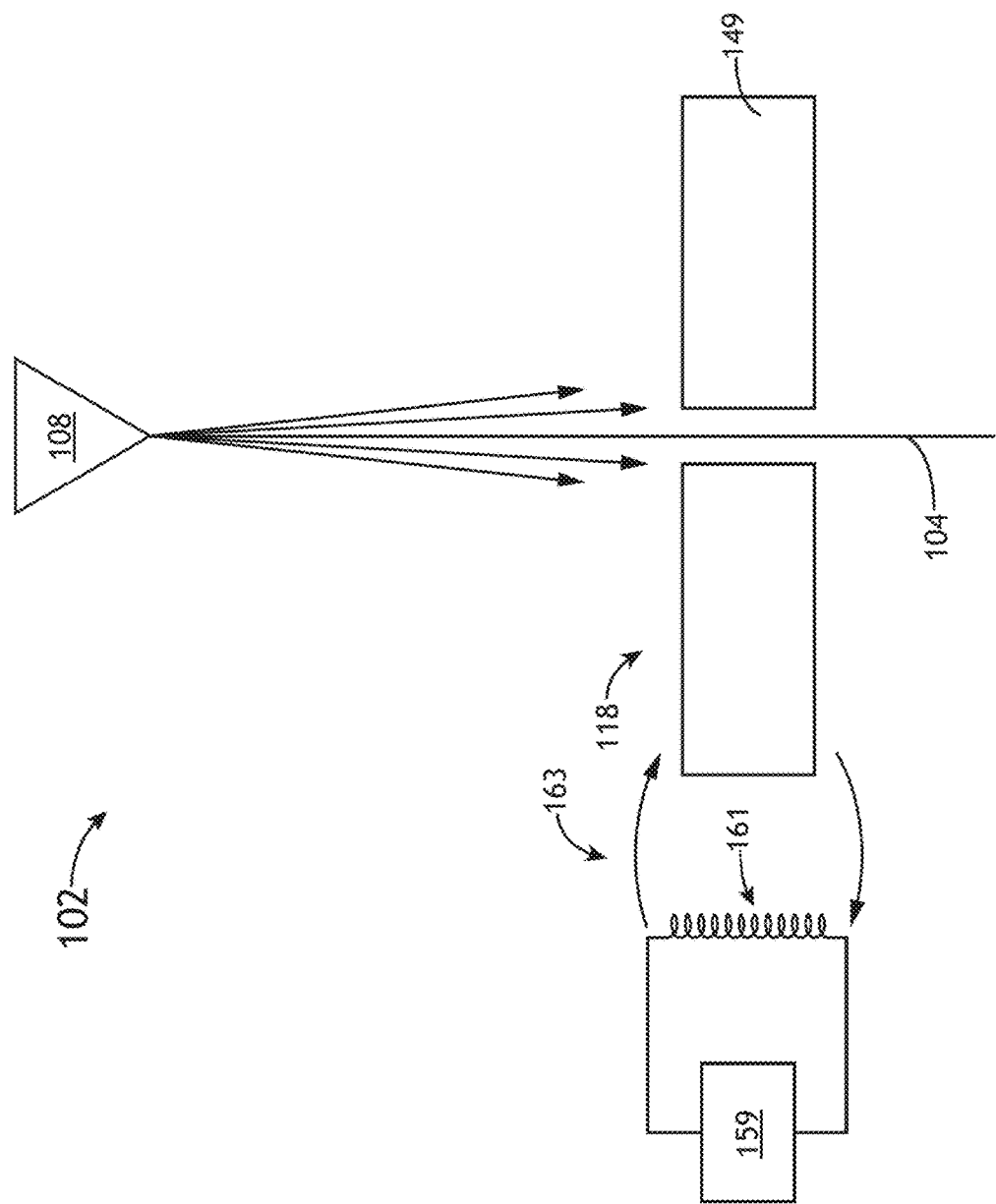

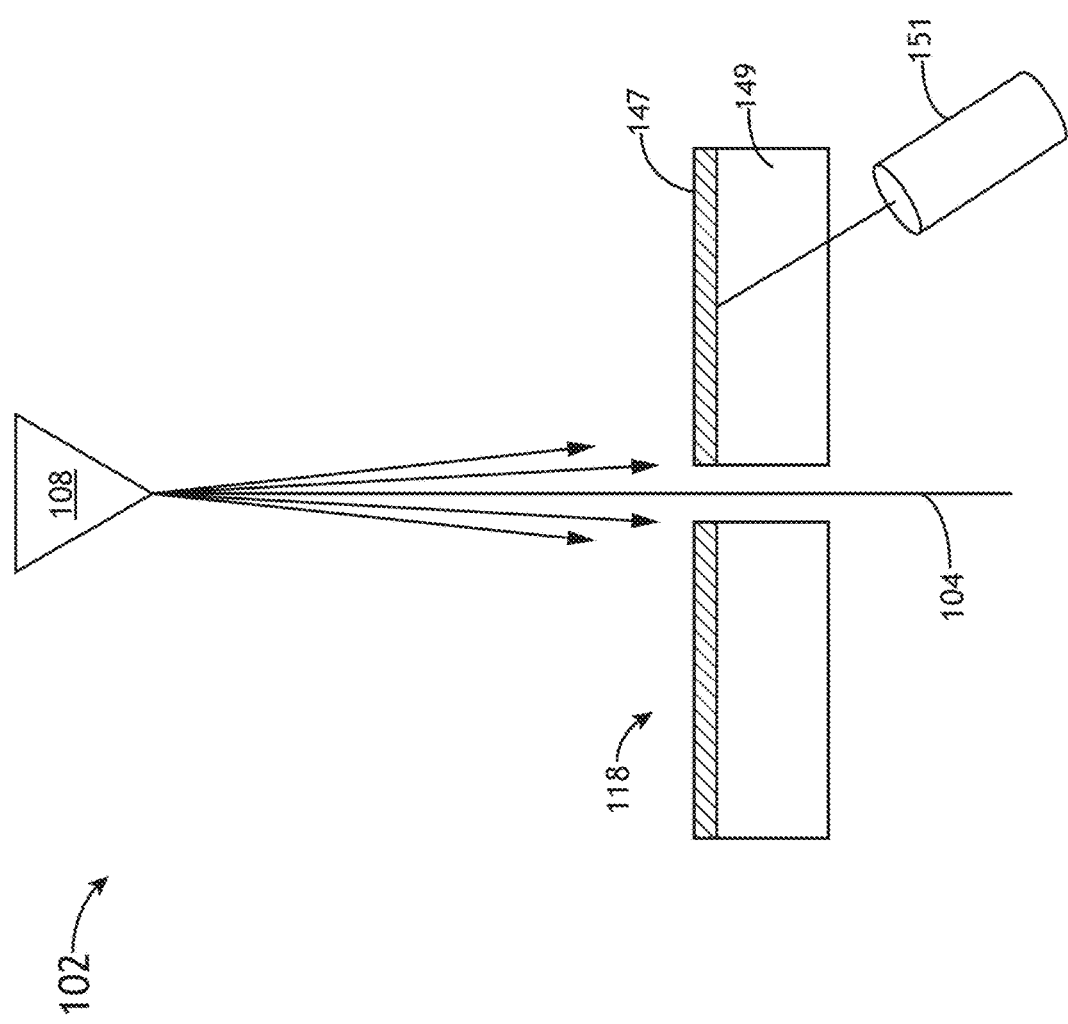

SYSTEM AND METHOD FOR PROVIDING A CLEAN ENVIRONMENT IN AN ELECTRON-OPTICAL SYSTEM

CROSS-REFERENCE TO RELATED APPLICATION

The present application claims benefit under 35 U.S.C. § 119(e) and constitutes a regular (non-provisional) patent application of U.S. Provisional Application Ser. No. 62/166,691, filed May 27, 2015, entitled MINIATURE PARTICLE OPTICAL ELEMENTS COMPRISED OF NON-EVAPORABLE GETTER MATERIALS, naming William George Schultz, Gildardo Rios Delgado and Garry Allen Rose as inventors, which is incorporated herein by reference in the entirety.

TECHNICAL FIELD

The present invention generally relates to electron-optical systems and, in particular, an electron-optical system equipped with a non-evaporable getter material for removing contaminants from the electron-optical system and locally reducing partial pressures of reactive gases in regions difficult-to-pump regions.

BACKGROUND

As electron-optic device size becomes ever smaller, it becomes more difficult to implement a controlled vacuum environment within a given electron-optical system. One such electron-optical system is that of a "miniature" electron-optical system, whereby one or more components of the electron-optical system, such as electron source or electron-optical column components, are significantly compact and positioned closely together. Further, in the case of a miniature electron-optical system, limited clearance space within the system limits the usefulness of traditional vacuum technologies. For instance, miniature electron-optical systems often have limited clearance space, often on the order of microns, between the electron emitter (e.g., carbon nanotube tube emitter) and the corresponding extractor of the electron source, making it difficult to control the vacuum environment within the region near the electron emitter and the extractor. It would be advantageous to provide a system and method that provides improved control of the vacuum environment of such electron-optical systems.

SUMMARY

An electron-optical apparatus with passive contaminant removal capabilities is disclosed, in accordance with one or more illustrative embodiments of the present disclosure. In one illustrative embodiment, the apparatus includes an electron source. In another illustrative embodiment, the apparatus includes an electron-optical column including a set of electron-optical elements configured to direct an electron beam onto a sample. In another illustrative embodiment, the apparatus includes a detector assembly configured to detect an electron signal emanating from a surface of the sample. In one illustrative embodiment, at least one of the electron source, the electron-optical column or the detector assembly includes an electron-optical element formed from a non-evaporable getter material. In another illustrative embodiment, the non-evaporable getter material absorbs one or more contaminants located within a cavity of at least one of the electron source, electron-optical column or the detector assembly.

An electron extractor for absorbing contaminants is disclosed, in accordance with one or more illustrative embodiments of the present disclosure. In one illustrative embodiment, the electron extractor includes a body. In one illustrative embodiment, the body of the electron extractor is formed from one or more non-evaporable getter materials. In one illustrative embodiment, the one or more non-evaporable getter materials absorb one or more contaminants contained within a region proximate to the body of the electron extractor. In another illustrative embodiment, the body of the electron extractor is further configured to extract electrons from one or more emitters positioned proximate to the body of the electron extractor.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 1B is a high level schematic illustration of an electron beam source including an electron extractor formed from a non-evaporable getter material, in accordance with one or more embodiments of the present disclosure.

FIG. 1E is a high level schematic illustration of an electron extractor equipped with a resistive heating device for activating the non-evaporable getter material of the electron extractor via resistive heating, in accordance with one or more embodiments of the present disclosure.

FIG. 1F is a high level schematic illustration of an electron extractor equipped with an induction coil for activating the non-evaporable getter material of the electron extractor via inductive heating, in accordance with one or more embodiments of the present disclosure.

FIG. 1G is a high level schematic illustration of an electron extractor equipped with a light source for activating the non-evaporable getter material of the electron extractor via light absorption, in accordance with one or more embodiments of the present disclosure.

DETAILED DESCRIPTION OF THE INVENTION

Reference will now be made in detail to the subject matter disclosed, which is illustrated in the accompanying drawings.

Figure 1A:
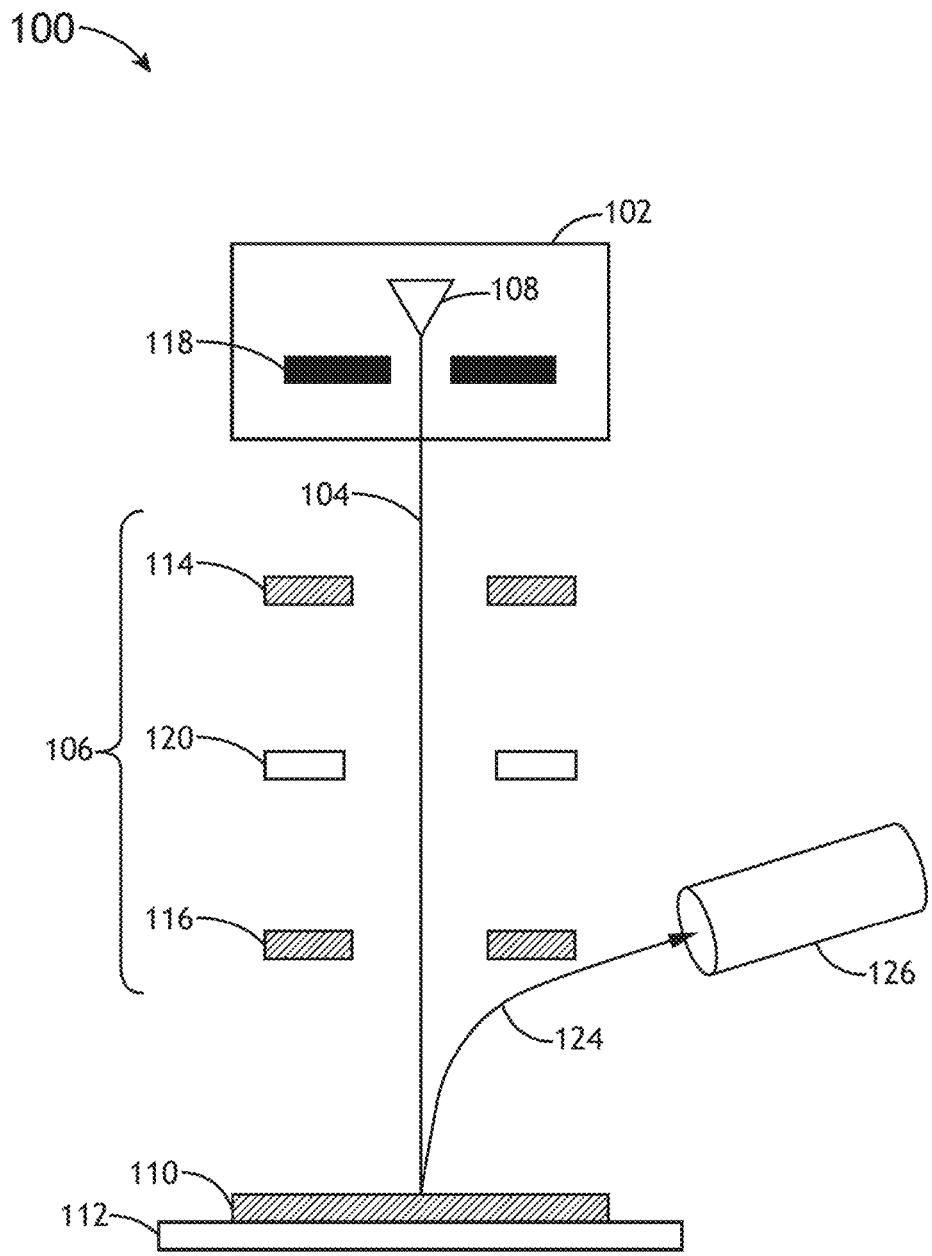
FIG. 1A is a high level schematic illustration of an electron-optical system including an electron extractor formed from a non-evaporable getter material, in accordance with one or more embodiments of the present disclosure.
Figure 1C:
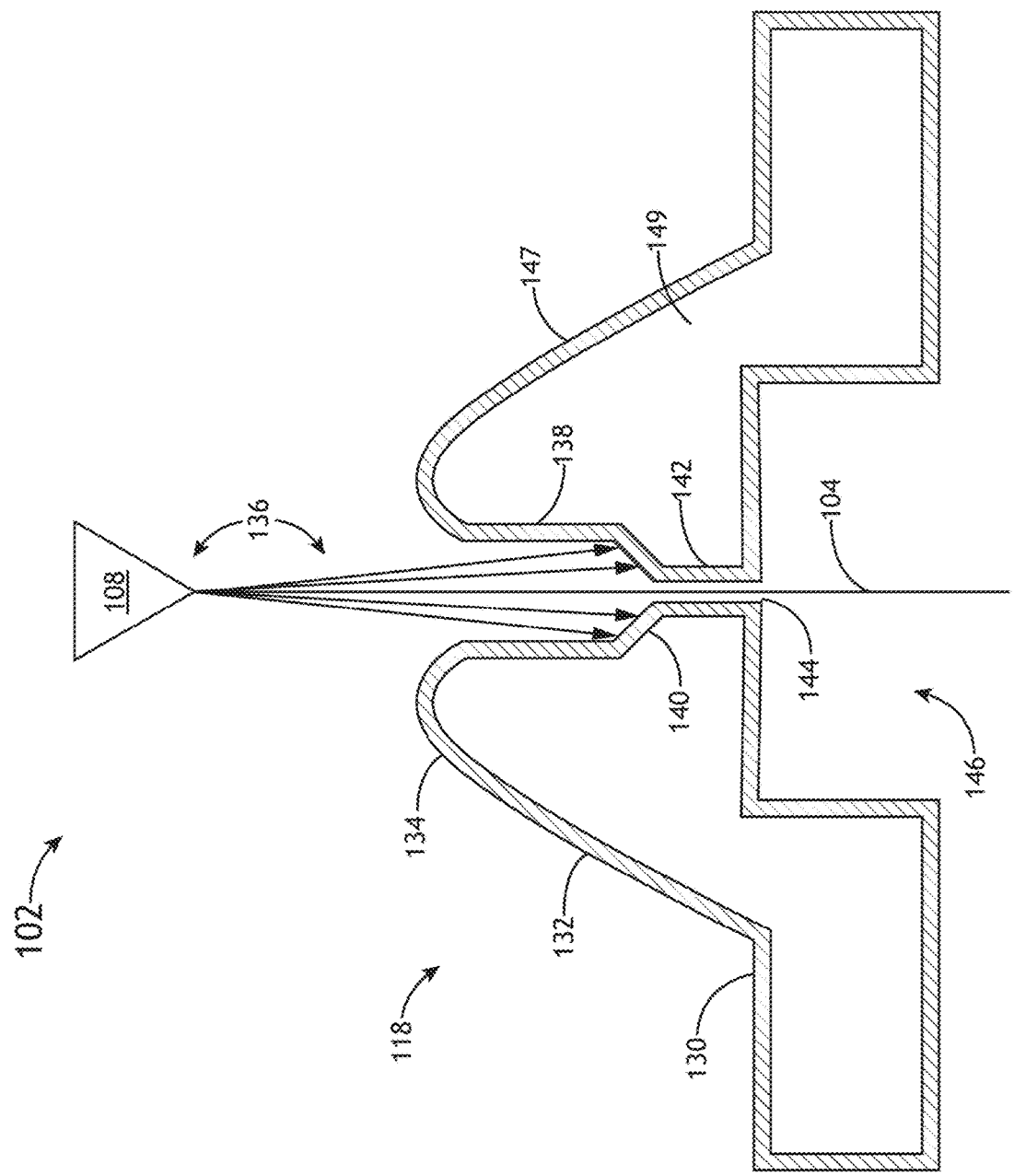
FIG. 1C is a high level schematic illustration of an electron-optical system including an electron extractor formed from a non-evaporable getter material, in accordance with one or more embodiments of the present disclosure.
Figure 1D:
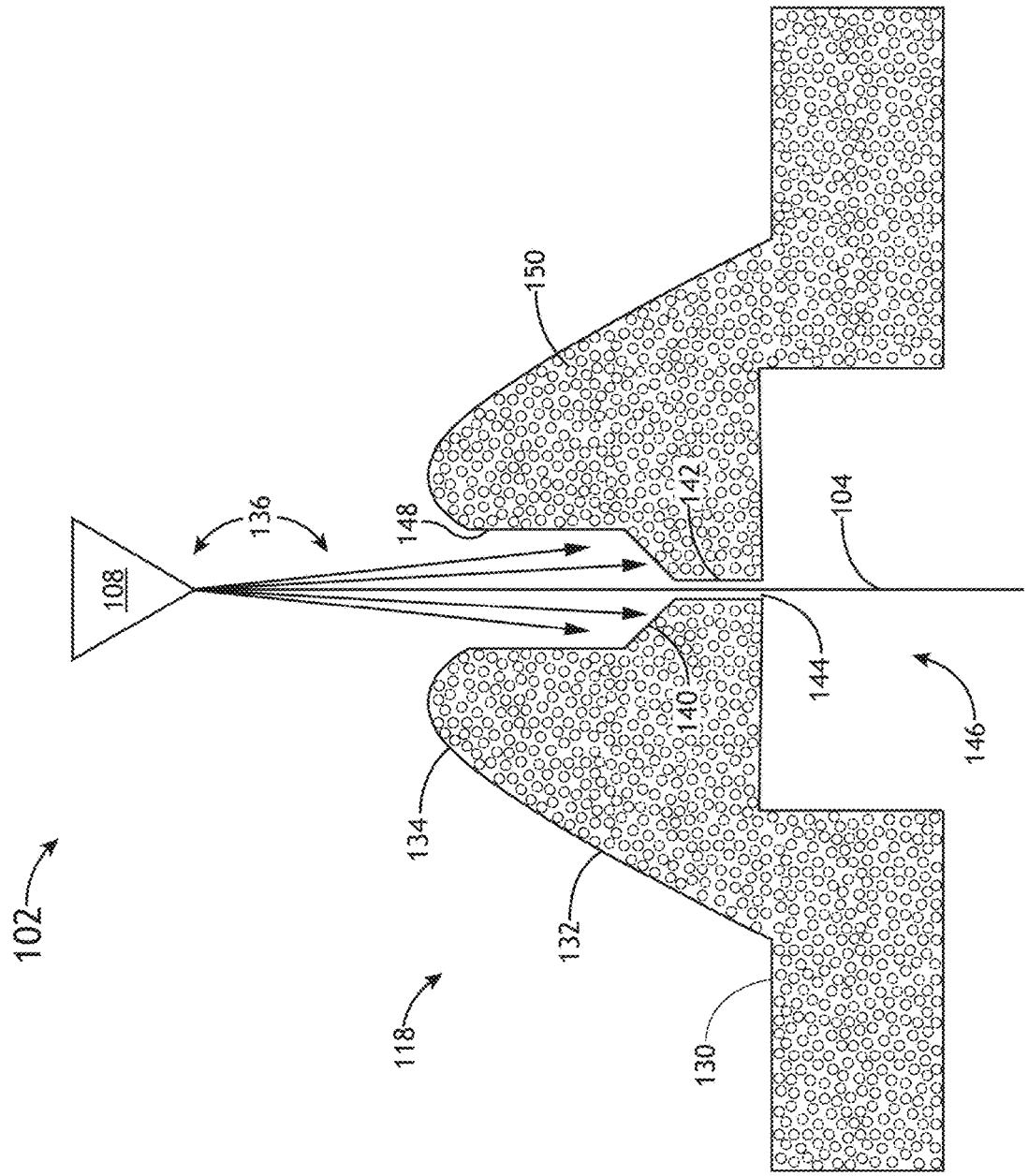
FIG. 1D is a high level schematic illustration of an electron-optical system including an electron extractor formed from a non-evaporable getter material, in accordance with one or more embodiments of the present disclosure.
Figure 1H:
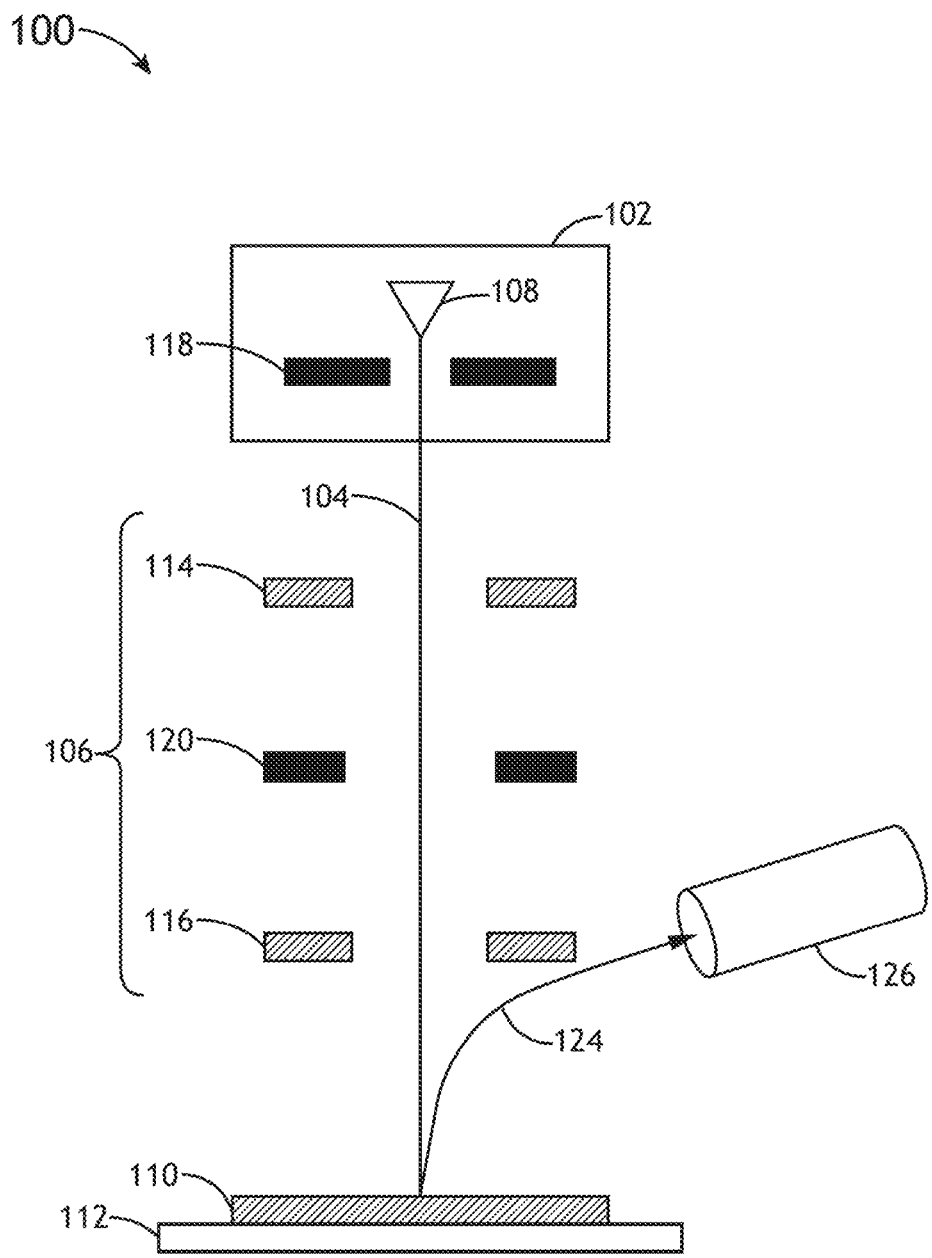
FIG. 1H is a high level schematic illustration of an electron-optical system including a set of deflectors of the electron-optical column formed from a non-evaporable getter material, in accordance with one or more embodiments of the present disclosure.
Figure 1I:
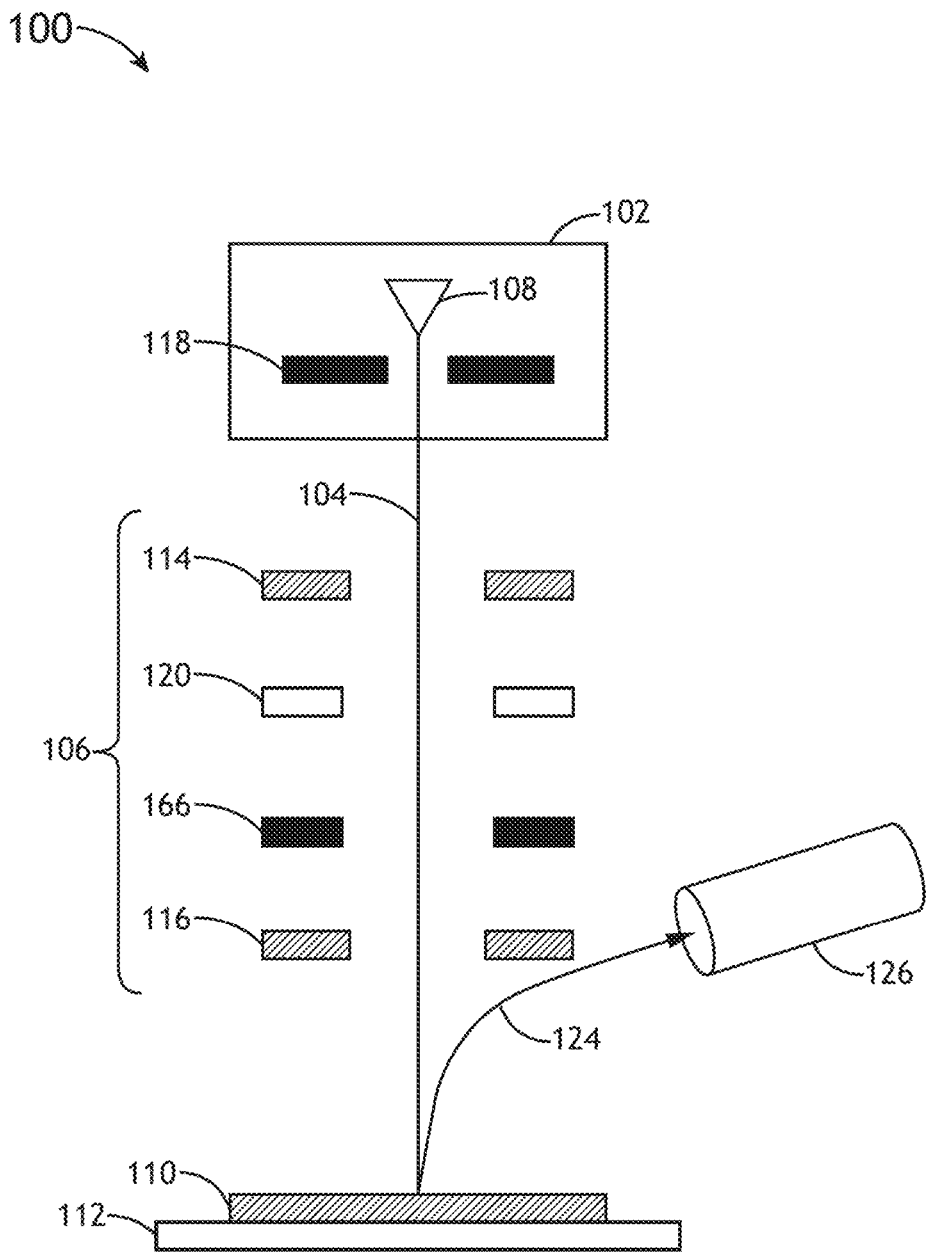
FIG. 1I is a high level schematic illustration of an electron-optical system including an astigmatism compensator formed from a non-evaporable getter material, in accordance with one or more embodiments of the present disclosure.
Figure 1J:
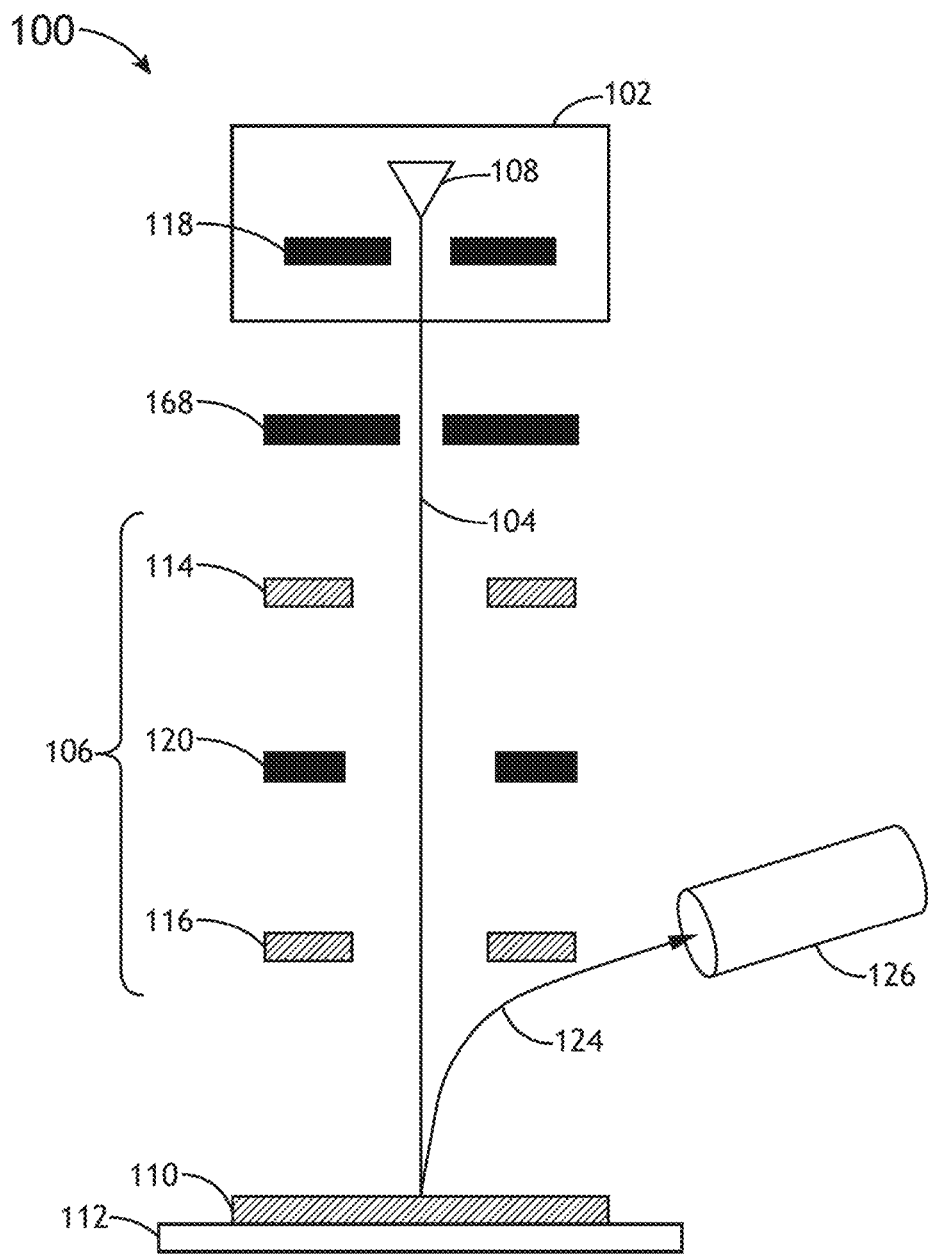
FIG. 1J is a high level schematic illustration of an electron-optical system including a current or beam limiting aperture formed from a non-evaporable getter material, in accordance with one or more embodiments of the present disclosure.
Figure 1K:
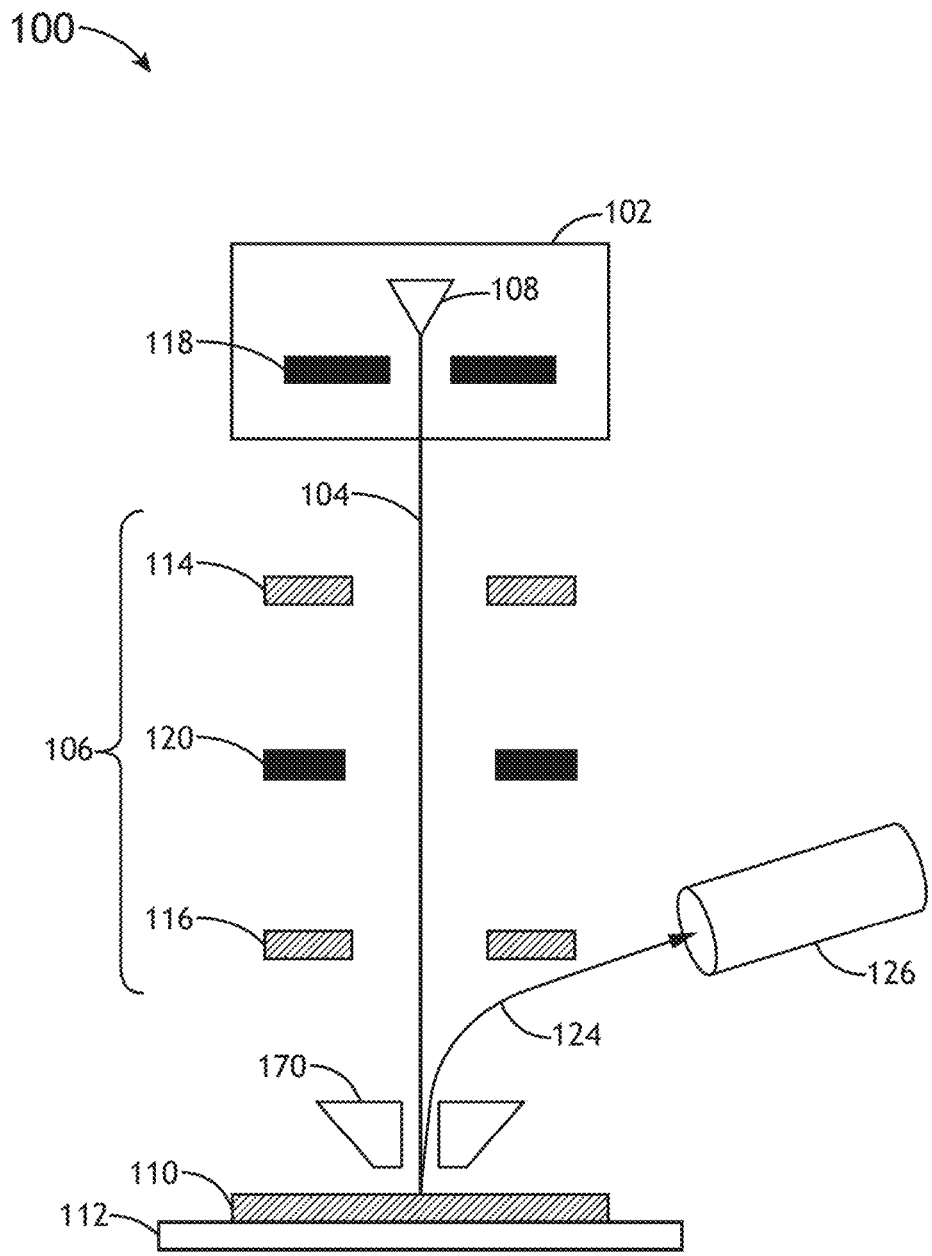
FIG. 1K is a high level schematic illustration of an electron-optical system including a soft electron extractor formed from a non-evaporable getter material, in accordance with one or more embodiments of the present disclosure.
Figure 1L:
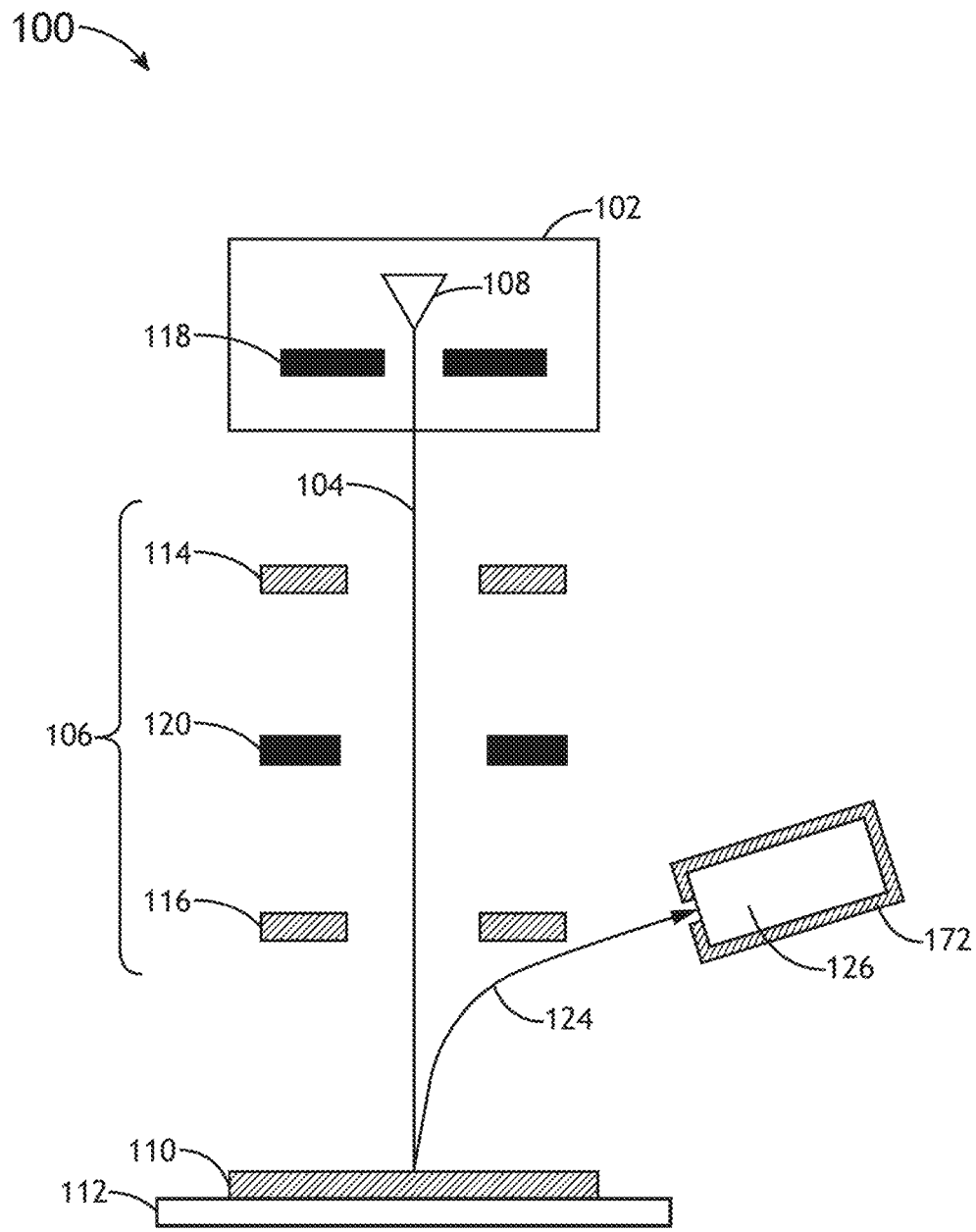
FIG. 1L is a high level schematic illustration of an electron-optical system including an out-of-column detector assembly including one or more components formed from a non-evaporable getter material, in accordance with one or more embodiments of the present disclosure.
Figure 1M:
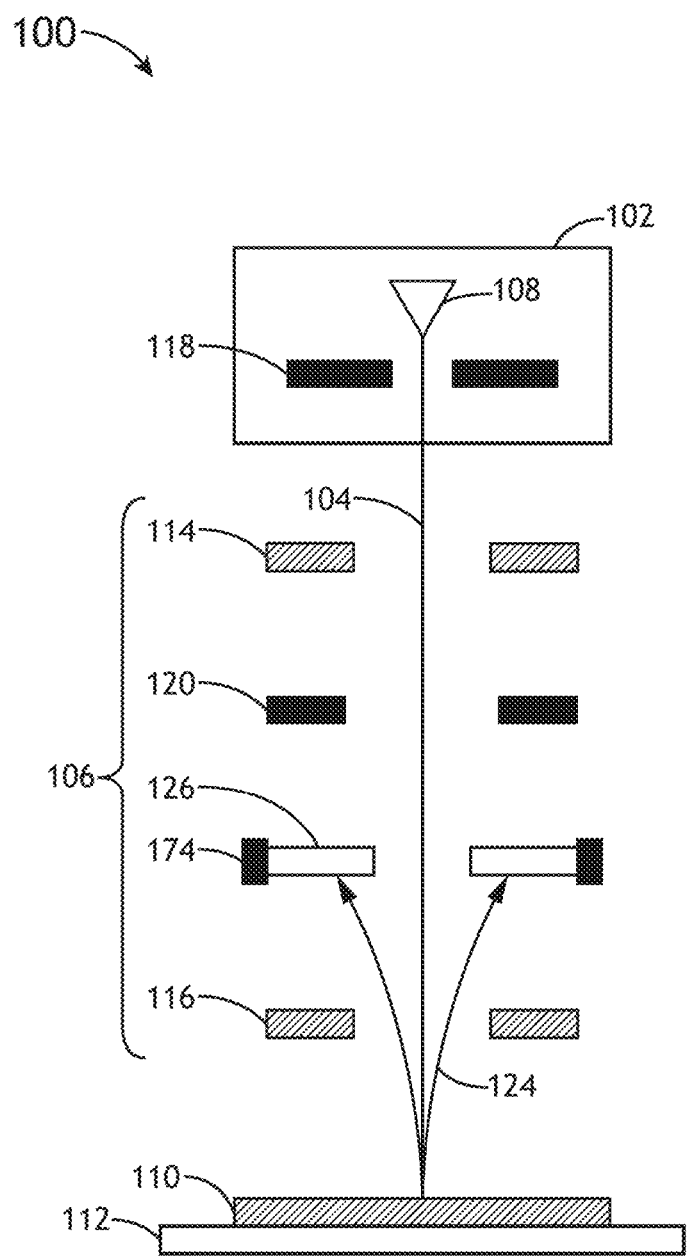
FIG. 1M is a high level schematic illustration of an electron-optical system including an in-column detector assembly including one or more components formed from a non-evaporable getter material, in accordance with one or more embodiments of the present disclosure.
Figure 2:
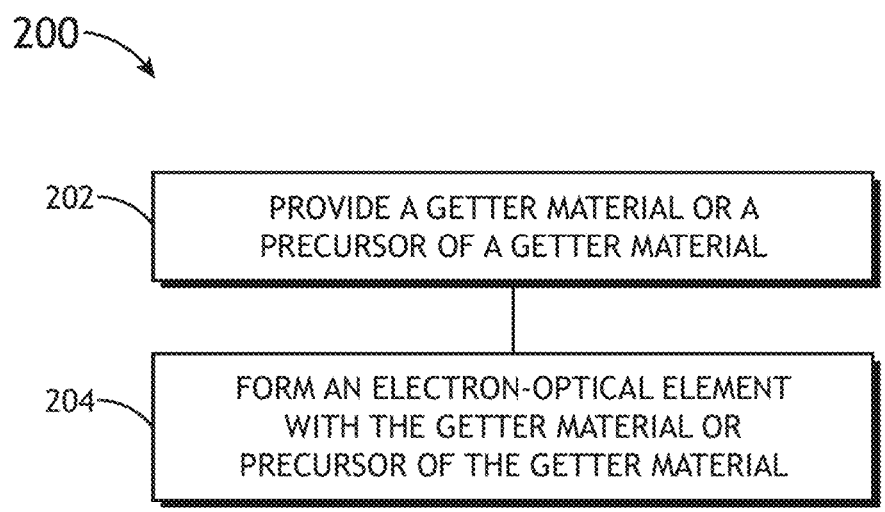
FIG. 2 is a process flow diagram illustrating a method of forming a non-evaporable getter element, in accordance with one or more embodiments of the present disclosure.

Referring generally to FIGS. 1A through 2, an electron-optical system including one or more electron-optical elements formed from a non-evaporable getter material and a method of forming the same are described, in accordance with the present disclosure.

It has been observed that considerable volumes of contaminants, such as, but not limited to, volatile organic compounds, water and/or other contaminants may be generated inside electron-optical systems. The contaminants generated within an electron-optical system, such as a miniature electron-optical system, may significantly contribute to emission instability of the electron-optical system. Further, in the case of a miniature electron-optical system, limited clearance space within the system restricts the removal of the contaminants via normal approaches, such as one or more vacuum technologies.

Embodiments of the present disclosure are directed to improving the stability of high brightness particle optic sources and systems through the implementation of non-evaporable getter (NEG) materials to fabricate components of the electron-optical system in close proximity to the vacuum environment of concern. The components of the electron-optical system formed from the non-evaporable getter materials may act to passively uptake (via chemical absorption and/or adsorption) one or more gaseous contaminants within the vacuum environment. In addition, the non-evaporable getter materials may also serve to reduce partial pressures of reactive gases in regions of the electron-optical system that are difficult to pump using conventional pumping approaches. Additional embodiments are directed to the formation of additional discrete components of the electron-optical system with a non-evaporable getter material.

For the purposes of the present disclosure, a "getter material" is considered to be a material capable of absorbing one or more selected contaminants and a "getter element" is a component of an electron-optical system formed from the selected getter material. Moreover, the term "non-evaporable getter materials" is interpreted to mean getter materials which do not readily evaporate when exposed to a vacuum environment.

Additional embodiments of the present disclosure are directed to providing a clean environment within the electron-optical system by forming one or more components of the electron-optical system, such as, but not limited to, a component of an electron source or one or more electron-optical elements of an electron-optical column, from a non-evaporable getter material. Such components may include one or more electron-optical elements of the electron-optical system. For the purposes of the present disclosure a non-evaporable getter element is interpreted to mean an electron-optical element formed from a non-evaporable getter material. In this regard, a non-evaporable getter element of the present disclosure serves at least the following functions: i) operating as an electron-optical element of the system; and ii) operating as a pumping component to eliminate or reduce contaminants within the system.

The embodiments of the present disclosure are particularly useful in the context of miniature electron-optical systems due to the difficulties associated with removing gas and gaseous contaminants from miniature electron-optical systems via traditional means and the heightened cleanness requirements of miniature electron-optical systems. Miniature electron-optical systems are characterized as such due to one or more sub-millimeter, micron-sized (or smaller) electron-optical elements.

The use of a getter material is generally described in U.S. Pat. No. 5,903,098, issued on May 11, 1999; U.S. Pat. No. 6,507,146, issued on Jan. 14, 2003; U.S. Pat. No. 6,545,396, issued on Apr. 8, 2003; U.S. Pat. No. 6,917,156, issued on Jul. 12, 2005; and U.S. Pat. No. 7,550,913, issued on Jun. 23, 2009; and EPO Patent Application No. 0,736,891 B1, published on Sep. 16, 1998, which are each incorporated herein by reference in their entirety. The use of a sintered getter in a scanning electron microscope is generally described in U.S. Pat. No. 5,150,001, issued on Sep. 22, 1992, which is incorporated herein by reference in its entirety. The use of a getter material in an electron emitter is generally described in U.S. Pat. No. 6,465,954, issued on Oct. 15, 2002; U.S. Pat. No. 6,741,017, issued on May 25, 2004; and U.S. Patent Publication No. 2008/0042547, published on Feb. 21, 2008, which are each incorporated herein by reference in their entirety. The use of a getter material in a carbon nanostructure field emitter is generally described in U.S. Pat. No. 7,608,824, issued on Oct. 27, 2009, which is incorporated herein by reference in its entirety. The use of a getter material in a cold emitter x-ray tube is generally described in U.S. Patent Application Publication No. 2003/0002627, published on Jan. 2, 2003, which is incorporated herein by reference in its entirety.

The use of a getter material in a field emission display is generally described in U.S. Pat. No. 5,223,766, issued on Jun. 29, 1993; U.S. Pat. No. 5,789,859, issued on Aug. 4, 1998; U.S. Pat. No. 5,583,393, issued on Dec. 10, 1996; U.S. Pat. No. 6,127,777, issued on Oct. 3, 2000; U.S. Pat. No. 7,745,995, issued on Jun. 29, 2010; and U.S. Pat. No. 8,766,542, issued on Jul. 1, 2014, which are each incorporated herein by reference in their entirety.

FIG. 1A illustrates an electron-optical system 100, in accordance with one or more embodiments of the present disclosure. In one embodiment, the electron-optical system 100 is a miniature electron-optical system. In another embodiment, the electron-optical system 100 is a miniature scanning electron microscopy (SEM) system. While the present disclosure largely focuses on an electron-optical arrangement associated with a miniature SEM system, it is noted herein that this does not represent a limitation on the scope of the present disclosure and is provided merely for illustrative purposes. It is contemplated herein that the embodiments described throughout the present disclosure may be extended to any electron-optical system configuration known in the art.

In one embodiment, the system 100 includes an electron beam source 102. In another embodiment, the system 100 includes an electron-optical column 106 for directing and/or focusing the electron beam 104 onto a sample 110. In another embodiment, the system 100 includes an electron detector assembly 126 for detecting one or more electron signals 124 emitted or scattered from the surface of the sample 110. As noted previously herein, one or more components of the electron source 102, the electron-optical column 106 and/or the detector assembly 126 are formed from a non-evaporable getter material.

The electron beam source 102 may include any electron beam source suitable for generating one or more electron beams 104. In one embodiment, the electron beam source 102 includes one or more electron emitters 108. For example, the one or more electron emitters 108 may include a single electron emitter. By way of another example, the one or more electron emitters 108 may include multiple electron emitters. The one or more electron emitters 108 may include any electron emitter known in the art of electron emission. For example, the one or more emitters 108 may include, but are not limited to, one or more field emission guns (FEGs). By way of another example, the one or more field emission guns may include, but are not limited to, a carbon nanotube emitter, a nanostructured carbon film emitter, a Muller-type emitter, a Spindt-type emitter, or a Schottky-type emitter.

In another embodiment, the electron beam source 102 includes one or more extractors 118 (or extractor electrodes). During operation, the one or more extractors 118 extract at least a portion of the electron beam 104 from the one or more electron emitters 108 and transmit the electron beam to the electron-optical column 106, which in turn directs the beam to the sample 110 disposed on sample stage 112.

The one or more extractors 118 of the electron beam source 102 may include any electron beam extractor configuration known in the art. For example, the electron beam extractor 118 may include a planar extractor. By way of another example, the electron beam extractor 118 may include a non-planar extractor. The use of a planar and non-planar extractor in an electron beam source is generally described in U.S. Pat. No. 8,513,619, issued on Aug. 20, 2013, which is incorporated herein by reference in its entirety.

FIG. 1B illustrates a cross-sectional view of an electron beam source 102, in accordance with one or more embodiments of the present disclosure. In one embodiment, as shown in FIG. 1B, the extractor 118 of the electron beam source 102 is a non-planar extractor 118.

In one embodiment, the non-planar extractor 118 includes an outer radius 130. In another embodiment, the extractor 118 includes a rounded portion 134. For example, the interior curve of the rounded portion 134 may form the opening surface to the extractor opening 138 in the emitter region 136. In another embodiment, the extractor 118 includes an outer sloped surface 132 between the rounded portion 134 and the outer radius 130. For instance, the outer sloped surface 132 may slope downward from the rounded portion 134 to the outer radius 130. Such a configuration may be referred to herein as a "volcano-shaped" extractor. In another embodiment, the extractor 118 may take on a conical-shape.

It is noted herein that the scope of the present disclosure is not limited to the configuration depicted in FIG. 1B, which is provided merely for illustrative purposes. Rather, the shape of the extractor 118 may take on any non-planar or planar configuration known in the art or described in the present disclosure.

In another embodiment, the extractor opening 138 leads to one or more converging portions 140. For example, the converging portion 140 may facilitate the transition between the extractor opening 138 and an opening slit 144. In this regard, the converging portion 140 leads to the beam-defining aperture 142, which may control the divergence and/or current of the electron beam 104. In another embodiment, the beam-defining aperture 142 leads to the opening slit 144. For example, the width of the extractor opening 138 may be larger than that of the opening slit 144. In another embodiment, the electron beam 104 passes through the aperture 142 and to the emission cavity 146.

Additionally, in this configuration, the majority of the electron beam 104 may terminate on the surfaces of the converging portion 140. For example, up to 90% of the electron beam 104 from the emitter 108 may terminate at the one or more converging portions 140. As a result, without mitigation, the electrons impinging on the surface of the extractor 118 continually cause desorption of contaminants.

In one embodiment, the one or more extractors 118 are formed from one or more getter materials. For example, the one or more extractors 118 may be formed from one or more non-evaporable getter materials. It is noted that by forming the one or more extractors 118 from one or more non-evaporable getter materials the stability of the emitter 108 (e.g., CNT emitter) may be improved through the continuous chemical absorption of the gaseous contaminants near the components of the electron source 102. For instance, the continuous pumping provided by the extractor 118 formed from one or more non-evaporable getter materials may act to chemically absorb gaseous contaminants at or near the cathode of the electron source 102, which is typically far removed from the primary pumping system of the electron-optical system 100. In this regard, the getter material of the extractor 118 acts as a small pump with very high solid angle of collection of neutrals and charged ionic species in one of the most critical environments in the electron-optical system 100.

Further, the geometry of the extractor 118, such as, but not limited to, the extractor geometry shown in FIG. 1B, establishes the field necessary for field emission at the emitter 108 independent of the material used to form the extractor 118.

The one or more getter materials may include any material suitable for absorbing one or more targeted contaminants. For instance, the one or more getter materials may be selected so as to chemically absorb one or more of the contaminants present within the electron-optical system 100, such as, but not limited to, $H_2$, $H_2O$, $CO$, $CO_2$, $O_2$, $N_2$, $NO$, $NO_2$ and the like. It is noted herein that the one or more contaminants may react with the one or more getter materials of the one or more extractors 118 to form a reaction product, such as, but not limited to, nonreactive metal oxides, carbides, and/or nitrides. In this regard, as the getter material is continually exposed to the contaminant materials, the getter material chemically reacts with the contaminant materials and forms a nonreactive compound, resulting in the uptake and sequestration of the contaminant material.

In one embodiment, the non-evaporable getter material used to form the one or more extractors 118 includes, but is not limited to, at least one of zirconium, vanadium, cobalt, aluminum, ruthenium, thorium, iron, molybdenum or boron. In another embodiment, the non-evaporable getter material includes a compound, mixture or alloy of one or more of zirconium, vanadium, cobalt, aluminum, ruthenium, thorium, iron, molybdenum or boron.

For example, the non-evaporable getter material may include, but is not limited to, a zirconium alloy. For instance, the non-evaporable getter material may include, but is not limited to, an alloy containing at least zirconium and titanium. In another instance, the non-evaporable getter material may include, but is not limited to, an alloy containing at least zirconium and vanadium, such as, but not limited to, St 707 (70% zirconium, 24.6% vanadium, and a balance of iron alloy). In another instance, the non-evaporable getter material may include, but is not limited to, an alloy containing at least zirconium and cobalt, such as, but not limited to, St 787 (80.8% zirconium, 14.2% cobalt, and mischmetal). In another instance, the non-evaporable getter material may include, but is not limited to, an alloy of at least zirconium and aluminum, such as, but not limited to, St 101 (84% zirconium and 16% aluminum).

It is further noted that the extractor 118 may be formed from a selected non-evaporable getter material so as to target a particular gaseous contaminant species for uptake. Table I below provides a list of example getter materials and the corresponding one or more gas species that the getter materials may effectively uptake.

TABLE I

| Getter material | Target Gas species | Getter capacity (Pa-l/mg) |
|---|---|---|
| Aluminum | $O_2$ | 1.0 |
| Barium | $CO_2$ | 0.7 |
| | $H_2$ | 11.5 |
| | $N_2$ | 1.3 |
| | $O_2$ | 2.0 |
| Magnesium | $O_2$ | 2.7 |
| Rare Earth Elements | $CO_2$ | 0.3 |
| (cerium, lanthanum) | $H_2$ | 6.1 |
| | $N_2$ | 0.4 |
| | $O_2$ | 2.8 |
| Titanium | $H_2$ | 27.0 |
| | $N_2$ | 0.9 |
| | $O_2$ | 4.4 |

It is noted that the listed of getter materials provided in Table I is not intended to be a limitation on the scope of the present disclosure and is provided merely for purposes of illustration. It is further noted that many getter reactions may be generalized as follows:

$$2GM + O_2 \rightarrow 2GMO \quad (1)$$

$$2GM + N_2 \rightarrow 2GMN \quad (2)$$

$$2GM + CO \rightarrow GMC + GMO \quad (3)$$

$$2GM + CO_2 \rightarrow CO + 2GMO \rightarrow GMC + GMO \quad (4)$$

$$GM + H_2O \rightarrow H + GMO \rightarrow GMO + H \text{ (bulk)} \quad (5)$$

$$GM + H_2 \rightarrow GMH + H \text{ (bulk)} \quad (6)$$

$$GM + C_xH_y \rightarrow GMC + H \text{ (bulk)} \quad (7)$$

$$GM + \text{Inert Gas (He, Ne, Ar, Kr, Xe)} \rightarrow \text{No reaction} \quad (8)$$

where GM represents the given getter material.

In another embodiment, the extractor 118 may be formed from two or more non-evaporable getter materials in order to target two or more particular gaseous contaminant species.

The extractor 118 may be formed from a chosen getter material using any formation means known in the art. In one embodiment, the extractor 118 may be formed via one or more mechanical processes. For example, the extractor 118 may be formed from one or more mechanical processes including, but not limited to, a lathing process, a milling process, or a drilling process. In this regard, a bulk solid volume of the getter material may be supplied and one or more mechanical processes may be applied to the volume of getter material in order to achieve the extractor 118 having the desired shape/size.

In another embodiment, the extractor 118 may be formed via one or more casting processes. For example, a molten form of the getter material or precursor of the getter material may be suppled and poured into a mold of the extractor 118. In another embodiment, the extractor 118 may be formed via one or more extrusion processes. For example, a solid volume of the getter material may be suppled and extruded through an extruder to achieve the extractor 118 having the desired shape/size.

In another embodiment, the extractor 118 may be formed via one or more powder metallurgical process, such as, but not limited to, a sintering process. In this regard, a volume of powdered getter material may be supplied and one or more sintering processes may be applied to achieve the extractor 118 having the desired shape/size.

In another embodiment, the extractor 118 may be formed via one or more optical processes, such as, but not limited to, laser ablation. In this regard, a bulk volume of the getter material may be supplied and one or more laser ablation processes may be applied to the volume of getter material to achieve the extractor 118 having the desired shape/size.

In another embodiment, the extractor 118 may be formed via one or more additive manufacturing processes. For example, the extractor 118 may be fabricated via a three-dimensional printing process. In this regard, getter material may be supplied and a 3-D printing tool may be used to form the extractor 118. In another embodiment, a selective laser sintering process may be applied to form the extractor 118. Selective laser sintering, used to three-dimensionally print materials, is generally described in U.S. Pat. No. 4,863,538, issued on Sep. 5, 1986, which is incorporated herein by reference in the entirety.

In another embodiment, the extractor 118 may be formed via one or more film formation processes. For example, as shown in FIG. 1C, one or more surface layers 147 of non-evaporable getter material may be deposited onto the surface of a substrate 149 to form the extractor 118. Any film deposition process known in the art may be used to form the one or more layers 147. For example, the one or more surface layers 147 may be deposited onto the substrate 149 using one or more of the methods including, but not limited to, sputtering, resistive evaporation, electron beam evaporation, vapor deposition, atomic layer deposition, electroplating, screen printing, solution casting or any other suitable deposition technique known in the art. The substrate 149 may include any substrate known in the art. For example, as discussed further herein, the substrate may include, but is not limited to, a substrate that is transparent to a selected wavelength (or range of wavelengths) of radiation. For instance, the substrate 149 may include a silicon substrate, which is transparent to 1064 nm light.

In another embodiment, as shown in FIG. 1D, the porosity of the body of the extractor 118 may be controlled during formation of the extractor 118. It is noted that the uptake ability of a given extractor 118 is dependent on the porosity of the extractor 118. In this regard, increased porosity provides for increased surface area (for absorbing contaminants) within the volume of the extractor 118. In contrast, increased porosity also decreases the overall bulk volume of the extractor 118, thereby reducing the ability of the extractor to "hold" or contain the absorbed contaminants. As a result, the extractor 118 may be formed with a selected porosity or within a selected porosity range, which serves to maximize uptake of one or more contaminants (or at least establishes uptake above a selected level). For example, the extractor 118 may be formed with a porosity of 0.05 to 0.95 of the theoretical density of the extractor 118. For instance, the extractor 118 may be formed with a porosity of 0.2 to 0.8 of the theoretical density of the extractor 118.

It is noted herein that any number of the fabrication techniques described above may be implemented to control porosity. In one embodiment, a sintering process utilizing a pore-forming step may be implemented to control the porosity of the extractor 118. For example, a pore-forming material (e.g., polyethylene spheres) may be added to and mixed with a volume of powdered non-evaporable getter material. Then, the mixture may undergo a sintering process to a desired sintering temperature at a desired pressure. In another embodiment, during the heat treatment of the sintering process, the pore forming material is burned out of the extractor, leaving behind a set of pores 150 of desired number and size. In another embodiment, the porosity of the extractor 118 may be controlled precisely through an additive manufacturing technique, such as, but not limited to, three-dimensional printing or laser sintering. In this regard, the additive manufacturing process may be used to control the size, number and location of pores (or voids) 150 within the extractor 118. In regard, the additive manufacturing process may form a regular or irregular pattern of getter material within the volume of the extractor 118.

In another embodiment, the extractor 118 formed from NEG material is activatable. As noted previously herein, the extractor 118 passively chemically absorbs one or more reactive contaminants from the emission region 136 and the emission cavity 146. The passive absorption of the extractor 118 may last for months. Further, the chemical absorption of reactive contaminants may be reversible. For example, an extractor 118 may be heated in order to chemically desorb contaminant material stored in the volume of the extractor 118. In this regard, in order to activate an extractor 118 that has reduced absorption capabilities due to uptake, an activation procedure may be performed by heating the extractor 118 using one or more approaches. Further, heating the extractor 118 causes one or more contaminants (or compounds of contaminants) to desorb from the extractor 118, allowing it to then be degassed by the system 100 when the system 100 is not in operation. For example, a heating process may be applied to heat the extractor to a temperature between 200 and 800° C. for a selected period of time (0.1 hours to 24 hours). It is noted herein that in some operation settings once the non-evaporable getter material of the extractor 118 is activated the system 100 may experience a temporary increase in pressure as chemisorbed species are liberated from the non-evaporable getter material. The liberated species may then be pumped out of the vacuum system of system 100 via traditional pumping means. Further, when cooled the non-evaporable getter material of the extractor 118 is cooled and the getter material begins to remove gasses and contaminants from the vacuum system of the system 100.

It is noted that any heating process may be applied to the extractor 118 in order to activate the extractor 118. In one embodiment, a resistive heating process may be applied to activate the extractor 118. For example, as shown in FIG. 1E, one or more resistive heating devices 156 (e.g., resistive heating coils) may be disposed within or on the extractor 118 and used to selectively heat the extractor 118. In another embodiment, control circuitry 158 may be used to control the operational state (e.g., ON/OFF state or temperature) of the resistive heating device 156 by controlling the current flowing through the device. Further, the one or more resistive heating devices may be used to activate the extractor 118 in-vacuo, eliminating the need to remove the extractor 118 from the system 100.

In another embodiment, in cases where the one or more non-evaporable getter materials of the extractor 118 are metal, an inductive heating process may be applied to activate the extractor 118. For example, as shown in FIG. 1F, one or more induction coils 161 may be inductively coupled to the metal non-evaporable getter material of the extractor 118, whereby energy is then transferred to the metal non-evaporable material via magnetic field(s) 163 to heat the one or more non-evaporable getter materials. In another embodiment, control circuitry 159 may be used to control the operational state (e.g., ON/OFF state or magnetic flux) of the induction coil 161 by controlling the current flowing through the device. Further, the inductive heating process may be used to activate the extractor 118 in-vacuo, again eliminating the need to remove the extractor 118 from the system 100. It is noted that the arrangement of the induction coil 161 is not intended to be a limitation on the present disclosure and is provided merely for illustrative purposes. It is recognized that any one or more induction coils, arranged in any geometrical relationship with the extractor 118 may be implemented in system 100. In addition, the one or more induction coils 161 may be inductively coupled to multiple NEG electron-optical elements of the system 100.

In another embodiment, the extractor 118 may be heated optically. For example, as shown in FIG. 1G, in cases where the non-evaporable getter material is a film layer deposited on a substrate, the substrate 149 may be chosen so it is transparent to a selected wavelength or wavelength range of light emitted by the light source 151. For instance, the substrate may include, but is not limited to, a silicon substrate, which is transparent to light of 1064 nm. In this embodiment, a beam of 1064 nm light may pass through the substrate 149 and heat the non-evaporable getter material deposited on (or about) the underlying silicon substrate 149. Further, optical heating may be used to activate the extractor 118 in-vacuo, again eliminating the need to remove the extractor 118 from the system 100. It is noted herein that these activation examples should not be interpreted to limit the scope of the present disclosure and are provided merely for illustrative purposes.

In another embodiment, a heating process may be applied to the extractor 118 outside of the vacuum of system 100. For example, a heating process may be applied with an oven to activate the extractor 118. In this regard, the extractor 118 may be removed from the system 100 and heat-treated utilizing an oven. Once the heat treatment is complete, the extractor 118 may be returned to the system 100.

While the present disclosure has focused on the implementation of one or more non-evaporable getter materials in the context of the extractor 118 of the electron source 102, this should not be interpreted as a limitation on the scope of the present disclosure. Rather, the above description related to the extractor 118 is provided merely for illustrative purposes. It is contemplated herein that the principles described above may also be extended to one or more components of the electron-optical column 106 and/or the detector assembly 126 of system 100.

FIG. 1F illustrates an electron-optical column 106 equipped with one or more electron-optical elements formed from one or more non-evaporable getter materials, in accordance with one or more embodiments of the present disclosure.

In one embodiment, as shown in FIG. 1H, the electron-optical column 106 includes one or more beam deflector elements 120. The one or more beam deflector elements 120 (e.g., quadrupole deflectors or octupole deflectors) may be formed from one or more non-evaporable getter materials. It is noted that the one or more deflector elements 120 may be formed by any of the methods and with any of the non-evaporable getter materials described previously herein.

In another embodiment, as shown in FIG. 1I, the electron-optical column 106 includes one or more astigmatism compensators 166 or stigmators. The one or more astigmatism compensators may be formed by any of the methods and with any of the non-evaporable getter materials described previously herein.

In another embodiment, as shown in FIG. 1J, the electron-optical column 106 includes one or more current or beam limiting apertures 168. In one embodiment, the one or more current or beam limiting apertures 168 may consist of a disc or foil shape including one or more holds for passage of the electron beam 104. The holes may have any shape known in the art. For example, the holes may be circular, square, rectangular or any other shape for projecting a shaped spot onto the sample 110. The one or more current or beam limiting apertures may be formed by any of the methods and with any of the non-evaporable getter materials described previously herein.

In another embodiment, as shown in FIG. 1K, the electron-optical column 106 includes a soft electron extractor 170 (or Wehnelt electrode). It is noted that the soft electron extractor 170 may face the sample surface. For instance, in the case of semiconductor fabrication, the sample surface may consist of a bare or resist coated semiconductor wafer. It is further noted that a resist coated semiconductor wafer may serve as significant contamination source. It is recognized herein that an active pumping element, such as the soft electron extractor 170 formed from non-evaporable getter material, placed in this would serve to reduce contamination of the surfaces facing the return beam path 124. The one or more soft electron extractors may be formed by any of the methods and with any of the non-evaporable getter materials described previously herein.

It is further noted that the set of electron-optical elements of the electron-optical column 106 may include any additional electron-optical elements known in the art suitable for focusing and/or directing the electron beam 104 onto a selected portion of the sample 110. In one embodiment, the set of electron-optical elements includes one or more electron-optical lenses. For example, the set of electron-optical elements may include one or more condenser lenses 114. By way of another example, the set of electron-optical elements includes one or more objective lenses 116. The one or more condenser lenses and one or more objective lenses may include any lens technology known in the art of electron-optics capable of shaping the electron beam 104.

The electron detector assembly 126 includes any detector technology known in the art capable of detecting electrons 124 emanating from the sample 110 (e.g., secondary electrons and/or backscattered electrons). For example, a secondary electron detector may include an electron collector, which collects secondary electrons 124 emitted by the surface of the sample 110. Further, the electron detector assembly 126 may include a detector for detecting the secondary electrons 124. For instance, the electron detector assembly 126 may include, but is not limited to, an Everhart-Thornley detector. By way of another example, the detector element may include, but is not limited to, a scintillating element and PMT detector. In another embodiment, the detector assembly 126 may include one or more of micro-channel plate (MCP), a PIN or p-n junction detector, such as a diode or a diode array or one or more avalanche photo diodes (APDs). In one embodiment, one or more portions of the detector assembly 126 may include one or more non-evaporable getter materials. For instance, as shown in FIG. 1L, the housing of the detector assembly 126 may be coated in or formed from a non-evaporable getter material 172.

FIG. 1M illustrates an in-column electron detector configuration, in accordance with one or more embodiments of the present disclosure. In one embodiment, the electron detector 126 is positioned within (or below) the electron-optical column 106. In this example, backscattered and/or secondary electrons 124 may be collected and imaged using one or more of micro-channel plate (MCP), a PIN or p-n junction detector, such as a diode or a diode array or one or more avalanche photo diodes (APDs). In one embodiment, one or more components of the in-column electron detector assembly 126, as shown in FIG. 1M, are coated or formed from non-evaporable getter materials. For instance, the detector region of the detector assembly 126 may be surrounded by a cylindrical wall 174 formed from non-evaporable getter material.

The one or more components of the electron detector assembly 126 may be formed by any of the methods and with any of the non-evaporable getter materials described previously herein.

FIG. 2 illustrates a process flow diagram depicting a method 200 for forming an electron-optical element from a non-evaporable getter element, in accordance with one or more embodiments of the present disclosure. It is noted herein that the various embodiments, components and architecture described previously herein should be interpreted to extend to the method 200 of FIG. 2.

In step 202, a non-evaporable getter material or a precursor of the non-evaporable getter material is provided. In one embodiment, the non-evaporable getter material includes, but is not limited to, at least one of zirconium, vanadium, cobalt, aluminum, ruthenium, thorium, iron, molybdenum or boron. In another embodiment, the non-evaporable getter element is formed from a non-electrically conductive material. In another embodiment, the non-evaporable getter element is formed from an electrically conductive material.

In a second step 204, an electron-optical element is formed from the non-evaporable getter material or the precursor of the non-evaporable getter material. The non-evaporable getter element may be formed by any fabrication process known in the art, such as, but not limited to, one or more mechanical processes, one or more powder metallurgical processes, one or more casting processes, one or more extrusion process, one or more optical processes, one or more additive manufacturing processes, and the like.

In another embodiment, the electron-optical element formed from a non-evaporable getter material includes one or more electron-optical elements of the electron source 102. For example, the one or more electron-optical elements of the electron source 102 may include, but are not limited to, one or more extractors 118.

In another embodiment, the electron-optical element formed from a non-evaporable getter material includes one or more electron-optical elements of the electron-optical column 106. For example, the one or more electron-optical elements of the electron-optical column 106 may include, but are not limited to, one or more of a deflector, a current limiting aperture, an astigmatism compensator, a soft extractor or the like.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An apparatus for generating an electron beam comprising:
   an electron source;
   an electron-optical column including a set of electron-optical elements configured to direct the electron beam onto a sample; and
   a detector assembly configured to detect an electron signal emanating from a surface of the sample, wherein the electron source includes an electron extractor, wherein a body of the electron extractor comprises a bulk volume of a non-evaporable getter material having a non-uniform thickness to absorb one or more contaminants located within a cavity of the electron source, wherein the non-evaporable getter material has a non-zero porosity level providing surface area within the body of the electron extractor for absorbing one or more contaminants, wherein the body of the electron extractor includes a rounded portion, wherein a top part of the rounded portion is oriented towards one or more emitters of the electron source.

2. The apparatus of claim 1, wherein the apparatus is a scanning electron microscopy system.

3. The apparatus of claim 2, wherein the apparatus is a miniature scanning electron microscopy system.

4. The apparatus of claim 1, wherein the one or more contaminants include at least one of a volatile organic compound or water vapor.

5. The apparatus of claim 1, wherein the non-evaporable getter material includes at least one of zirconium, vanadium, cobalt, aluminum, ruthenium, thorium, iron, molybdenum, or boron.

6. The apparatus of claim 1, wherein the selected porosity level is between 0.05 and 0.95 of the theoretical density of an electron-optical element of the set of electron-optical elements.

7. An electron extractor for absorbing contaminants comprising:
   a body, wherein the body of the electron extractor comprises a bulk volume of one or more non-evaporable getter materials having a non-uniform thickness to absorb one or more contaminants contained within a region proximate to the body of the electron extractor, wherein the one or more non-evaporable getter materials have a non-zero porosity level providing surface area within the body of the electron extractor for absorbing the one or more contaminants, wherein the body of the electron extractor includes a rounded portion, wherein a top part of the rounded portion is oriented towards one or more emitters, wherein the body of the electron extractor is further configured to extract electrons from the one or more emitters.

8. The electron extractor of claim 7, wherein the electron extractor comprises:
   an opening; and
   a beam-defining aperture configured to control angular trajectories of electrons in an electron beam.

9. The electron extractor of claim 8, wherein the electron extractor comprises:
   a converging portion between the opening and the beam-defining aperture.

10. The electron extractor of claim 8, wherein the rounded portion is positioned laterally between the opening and an outer edge of the electron extractor.

11. The electron extractor of claim 10, wherein the electron extractor comprises:
    an outer sloped surface between the rounded portion and an outer radius of the electron extractor.

12. The electron extractor of claim 7, wherein the body of the electron extractor is formed from at least one of an electrically conductive material.

13. The electron extractor of claim 7, wherein the electron extractor is formed from a non-electrically conductive material.

14. The electron extractor of claim 7, wherein the body of the electron extractor is formed via at least one of a mechanical process, a powder metallurgical process, a casting process, an extrusion process, an optical process, or an additive manufacturing process.

15. A method for forming an electron-optical element that serves as a contaminant getter comprising:
    providing a non-evaporable getter material for absorbing one or more contaminants contained within a region proximate to the non-evaporable getter material; and
    forming an electron extractor with the provided non-evaporable getter material, wherein a body of the electron extractor comprises a bulk volume of the non-evaporable getter material having a non-uniform thickness and a non-zero porosity level providing a surface area within the body of the electron extractor for absorbing the one or more contaminants, wherein the electron extractor includes a rounded entrance portion for receiving electrons from one or more emitters of an electron source.

16. An apparatus for generating an electron beam comprising:
    an electron source;
    an electron-optical column including a set of electron-optical elements configured to direct the electron beam onto a sample; and
    a detector assembly configured to detect an electron signal emanating from a surface of the sample, wherein at least one of the electron-optical column or the detector assembly includes an electron-optical element, wherein a body of the electron-optical element comprises a bulk volume of a non-evaporable getter material having a non-uniform thickness to absorb one or more contaminants located within a cavity of at least one of the electron-optical column or the detector assembly, wherein the non-evaporable getter material has a non-zero porosity level providing surface area within the body of the electron-optical element for absorbing the one or more contaminants.

17. The apparatus of claim 1, wherein an absorption state of the electron extractor formed from a non-evaporable getter material is activatable by at least one of resistive heating, inductive heating, or optical heating.

* * * * *